United States Patent
Yamamoto et al.

[11] Patent Number: 6,066,993
[45] Date of Patent: May 23, 2000

[54] DUPLEXER CIRCUIT APPARATUS PROVIDED WITH AMPLIFIER AND IMPEDANCE MATCHING INDUCTOR

[75] Inventors: Kazuya Yamamoto; Takao Moriwaki, both of Tokyo, Japan

[73] Assignee: Mitsubishi Denki Kabushiki Kaisha, Tokyo, Japan

[21] Appl. No.: 09/113,284

[22] Filed: Jul. 10, 1998

[30] Foreign Application Priority Data

Jan. 16, 1998 [JP] Japan .................................. 10-006468

[51] Int. Cl.[7] ................................ H01P 1/15; H04B 1/48
[52] U.S. Cl. .............................................. 333/103; 455/83
[58] Field of Search ................................... 333/103, 104; 330/311; 455/78, 80, 82, 83; 327/404

[56] References Cited

U.S. PATENT DOCUMENTS

| | | | |
|---|---|---|---|
| 4,637,073 | 1/1987 | Selin et al. ................................. | 455/78 |
| 5,327,583 | 7/1994 | Yamada et al. ............................. | 455/89 |
| 5,477,184 | 12/1995 | Uda et al. ............................. | 333/103 X |
| 5,774,792 | 6/1998 | Tanaka et al. ....................... | 333/103 X |
| 5,777,530 | 7/1998 | Nakatuka ................................. | 333/104 |
| 5,784,687 | 7/1998 | Itoh et al. ................................. | 455/78 |
| 5,883,541 | 3/1999 | Tahara et al. ........................ | 333/103 X |

*Primary Examiner*—Paul Gensler
*Attorney, Agent, or Firm*—Leydig, Voit & Mayer, Ltd.

[57] ABSTRACT

A duplexer circuit apparatus includes (a) a transmission arm circuit including a first switching circuit which is connected between a transmitter and an antenna, is turned on during transmission, and is turned off during reception, and (b) a reception arm circuit including a second switching circuit which is connected between a receiver and the antenna, is turned off during transmission, and is turned on during reception. In the duplexer circuit apparatus, either the transmitter or the receiver is selectively connected to the antenna, and the transmission arm circuit further includes a cascode amplifier, and an impedance matching inductor connected between the cascode amplifier and the antenna. In this case, the cascode amplifier may be replaced by a source-grounded amplifier constituted by only the FET.

13 Claims, 12 Drawing Sheets

DUPLEXER CIRCUIT APPARATUS PROVIDED WITH AMPLIFIER AND IMPEDANCE MATCHING INDUCTOR

BACKGROUND OF THE INVENTION

1. Field of the Invention

The present invention relates to a duplexer circuit apparatus for selectively connecting either a transmitter or a receiver to one antenna, and in particular, to a duplexer circuit apparatus having an output stage of an integrated cascode amplifier.

2. Description of the Prior Art

Conventionally, GaAs duplexer circuits have been widely used in portable telephones and the like. FIG. 11 shows a circuit diagram of a series and parallel type duplexer circuit of the prior art.

Referring to FIG. 11, the reference numerals $F_1$ to $F_4$ denote depletion mode field-effect transistors for duplexer (a field-effect transistor being referred to as an FET hereinafter), while the reference numerals $R_{d1}$ to $R_{d4}$ denote resistors having a resistance of an order of kilo-ohms for making the drains and sources of the FETs have equivalent electric potentials or voltages. The reference numerals $R_{g1}$ to $R_{g4}$ denote gate resistors of an order of kilo-ohms of the FETs, while the reference numerals $C_1$ to $C_4$ denote capacitors for disconnecting the sources of the FETs $F_1$ to $F_4$ from the ground in terms of direct current, the sources being grounded in terms of high frequency.

In the specification, disconnecting a circuit point A from a circuit point B in terms of direct current means that the direct current does not flow between points A and B, and grounding point A in terms of high frequency means that a high frequency signal flows from point A to the ground.

The reference numeral 1 denotes a transmitter connecting terminal, the reference numeral 2 denotes a receiver connecting terminal, and the reference numeral 3 denotes an antenna connecting terminal. The reference numerals 4 and 5 denote terminals, to which control voltages $V_{TX}$ and $V_{RX}$ for switching between transmission and reception are applied, respectively. Further, the transmitter connecting terminal 1 is connected to a pull-up voltage $V_{UP}$ via a pull-up resistor $R_{UP}$ having a resistance of an order of kilo-ohms for pulling up the electric potential or voltage of a transmission arm circuit located between the terminals 1 and 3 as well as the electric potential or voltage of a reception arm circuit located between the terminals 2 and 3, thereby allowing the duplexer circuit to be controlled by a control voltage having a positive voltage or zero voltage. An operation of the duplexer circuit is shown in Table 1.

TABLE 1

| | First Prior Art | | |
|---|---|---|---|
| | $V_{UP}$ | $V_{TX}$ | $V_{RX}$ |
| Transmission Mode | $V_{dd}$ | $V_{dd}$ | 0 V |
| Reception Mode | $V_{dd}$ | 0 V | $V_{dd}$ |

As is apparent from Table 1, during transmission, the pull-up voltage $V_{UP}$ and the control voltage $V_{TX}$ are set to the power source voltage $V_{dd}$, while the control voltage $V_{RX}$ is set to 0 V to turn off the FETs $F_1$ and $F_3$ and turn on the FETs $F_2$ and $F_4$, so that a high-frequency signal inputted from the transmitter via the terminal 1 is transmitted to the antenna 103 via the FET $F_2$ and the terminal 3. In this stage, the FET $F_3$ is in an OFF-state and the FET $F_4$ is in an ON-state, and therefore, no transmission high-frequency signal is transmitted from the transmitter 101 to the receiver 102. During reception, the pull-up voltage $V_{UP}$ and the control voltage $V_{RX}$ are set to the power source voltage $V_{dd}$, while the control voltage $V_{TX}$ is set to 0 V to turn off the FETs $F_2$ and $F_4$ and turn on the FETs $F_1$ and $F_3$, so that the high-frequency signal that has been received by the antenna 103 and inputted via the terminal 3 is transmitted via the FET $F_3$ and the terminal 2 to the receiver 102. In this stage, the FET $F_2$ is in an OFF-state and the FET $F_1$ is in an ON-state, and therefore, the reception high-frequency signal is not transmitted from the antenna 103 to the transmitter 101. In this case, each of pinch-off voltages $V_P$ of the FETs $F_1$ to $F_4$ is set to be lower than the power source voltage $V_{dd}$.

FIG. 12 is a circuit diagram showing a constitution of a cascode power amplifier of a second prior art.

Referring to FIG. 12, the reference numerals $F_1$ and $F_2$ denote depletion mode FETs for power amplification, the reference numerals $R_{g1}$ and $R_{g2}$ denote gate resistors for applying a gate voltage to the FETs $F_1$ and $F_2$, while the reference numerals $C_{g1}$ and $C_{g2}$ denote high-frequency bypassing capacitors. The reference symbols $L_d$ and $C_d$ denote an inductance and a capacitor constituting an output impedance matching circuit of the cascode power amplifier, the reference symbols $C_t$ and $C_a$ denote high-frequency coupling capacitors, and the reference numeral $L_{d2}$ denotes a high-frequency blocking inductor for supplying a power. The reference numeral 81 denotes an input terminal through which a high-frequency signal to be amplified is inputted, while the reference numeral 82 denotes an output terminal for outputting a high-frequency signal obtained after amplification. Further, the reference numeral $V_{d2}$ denotes a power source voltage, the reference numerals $V_{g1}$ and $V_{g2}$ denote gate voltages to be applied to the FETs $F_1$ and $F_2$, respectively.

It is to be noted that the GaAs cascode power amplifier generally has a complicated constitution or circuit and requires a higher voltage to output the required power. Therefore, the GaAs cascode power amplifier is scarcely used in the final stage of a power amplifier, and a source-grounded FET amplifier circuit, which is constituted by only the FET $F_1$ and obtained by removing the FET $F_2$ from the circuit shown in FIG. 12, is frequently used.

However, if a case where the power amplifier shown in FIG. 12 and the duplexer circuit shown in FIG. 11 are integrated on an identical chip is put into consideration, then the prior art duplexer circuit, which is constituted by connecting the terminal 1 shown in FIG. 11 to the terminal 82 shown in FIG. 12, has had such a problem that the circuit dimensions become relatively large. In other words, if the power amplifier shown in FIG. 12 and the duplexer circuit shown in FIG. 11 are integrated without modification, the circuit dimensions further increase, meaning that the circuit cannot be compacted.

SUMMARY OF THE INVENTION

An essential object of the present invention is to solve the above-mentioned problems and provide a duplexer circuit apparatus capable of being compacted as compared with the prior art.

In order to achieve the above-mentioned objective, according to one aspect of the present invention, there is provided a duplexer circuit apparatus comprising:

a transmission arm circuit connected between a transmitter and an antenna, said transmission arm circuit including a first switching circuit which is turned on during transmission, and is turned off during reception; and a reception arm circuit connected between a receiver and said antenna, said reception arm circuit including a second switching circuit which is turned off during transmission, and is turned on during reception, wherein either said transmitter or said receiver is selectively connected to said antenna, wherein said transmission arm circuit comprises:
a cascode amplifier; and
an impedance matching inductor connected between said cascode amplifier and said antenna.

According to another aspect of the present invention, there is provided a duplexer circuit apparatus comprising:

a transmission arm circuit connected between a transmitter and an antenna, said transmission arm circuit including a first switching circuit which is turned on during transmission, and is turned off during reception; and a reception arm circuit connected between a receiver and said antenna, said reception arm circuit including a second switching circuit which is turned off during transmission and is turned on during reception, wherein either said transmitter or said receiver is selectively connected to said antenna, wherein said transmission arm circuit comprises:
a source-grounded type amplifier; and
an impedance matching inductor connected between said source-grounded type amplifier and said antenna.

In the above-mentioned duplexer circuit apparatus, said second switching circuit preferably comprises a plurality of FETs connected in parallel with one another, each of said FETs being operated so as to be turned off during transmission and be turned on during reception.

In the above-mentioned duplexer circuit apparatus, said second switching circuit preferably comprises a plurality of FETs connected in series with one another, each of FETs being operated so as to be turned off during transmission and be turned on during reception.

In the above-mentioned duplexer circuit apparatus, said second switching circuit preferably comprises a plurality of FETs connected in parallel and series with one another, each of said FETs being operated so as to be turned off during transmission and be turned on during reception.

According to a further aspect of the present invention, there is provided a duplexer circuit apparatus for selectively connecting either first or second transmitters or a receiver to an antenna, comprising:

a first transmission arm circuit connected between said first transmitter and said antenna, said first transmission arm circuit including a first switching circuit which is turned on during transmission, and is turned off during reception; and a second transmission arm circuit connected between said second transmitter and said antenna, said second transmission arm circuit including a second switching circuit which is turned on during transmission, and is turned off during reception; and a reception arm circuit connected between said receiver and said antenna, said reception arm circuit including a third switching circuit which is turned off during transmission, and is turned on during reception, wherein each of said first and second transmission arm circuits comprise:

a cascode amplifier; and
an impedance matching inductor connected between said cascode amplifier and said antenna.

In the above-mentioned duplexer circuit apparatus, said third switching circuit preferably comprises a plurality of FETs connected in parallel with one another, each of said FETs being operated so as to be turned off during transmission and be turned on during reception.

In the above-mentioned duplexer circuit apparatus, said third switching circuit comprises a plurality of FETs connected in series with one another, each of said FETs being operated so as to be turned off during transmission and be turned on during reception.

Accordingly, by incorporating the cascode power amplifier into the transmission arm circuit of the duplexer circuit, the chip size can be remarkably reduced in the chip obtained by integrating the power amplifier with the duplexer circuit, and the insertion loss during transmission of the duplexer circuit can be reduced. Furthermore, the impedance matching of the antenna with the receiver can be more easily achieved.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which.

DETAILED DESCRIPTION OF THE PREFERRED EMBODIMENTS

Preferred embodiments of the present invention will be described below with reference to the drawings.

First Preferred Embodiment

Figure 1:
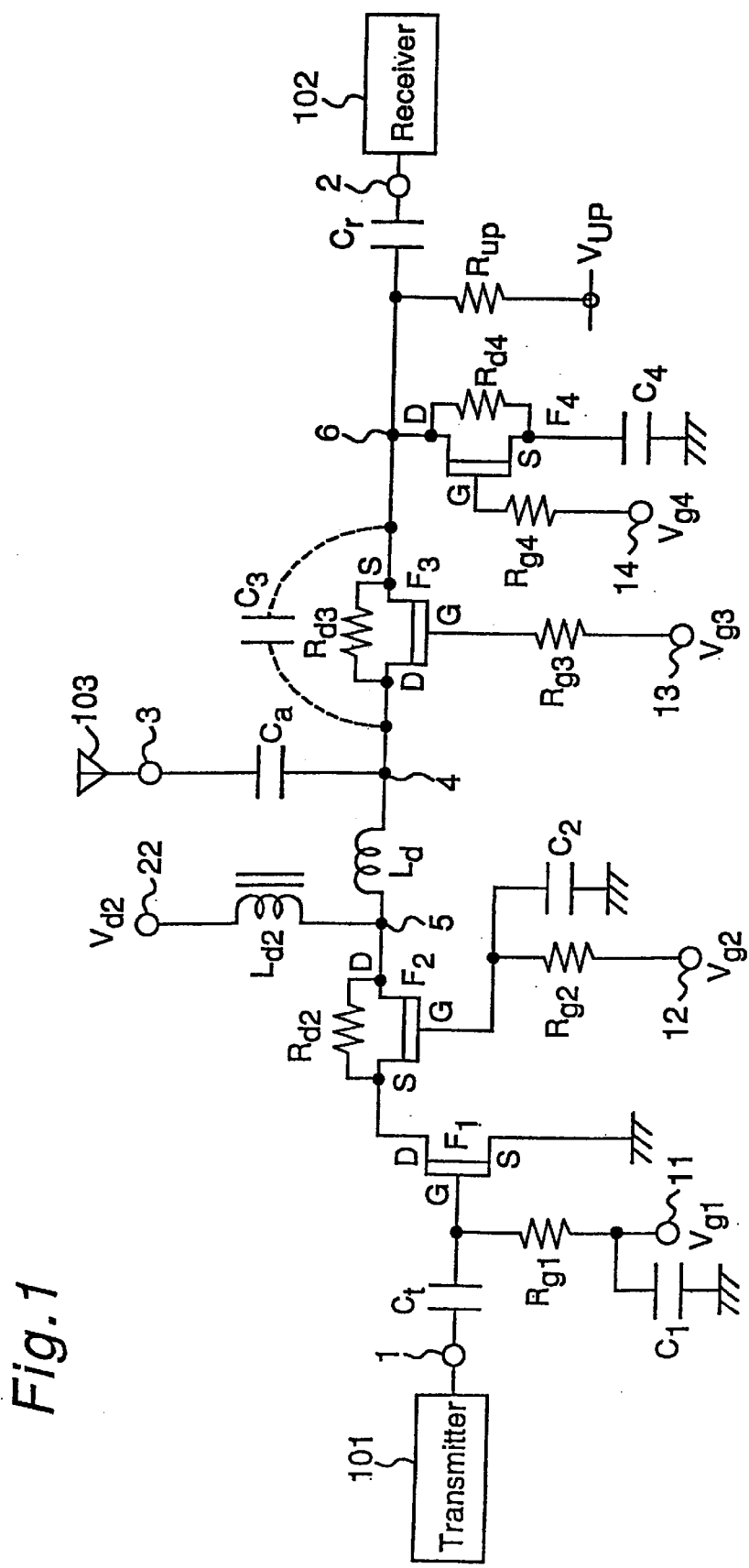
FIG. 1 is a circuit diagram showing a constitution of a duplexer circuit according to a first preferred embodiment of the present invention.
Figure 11:
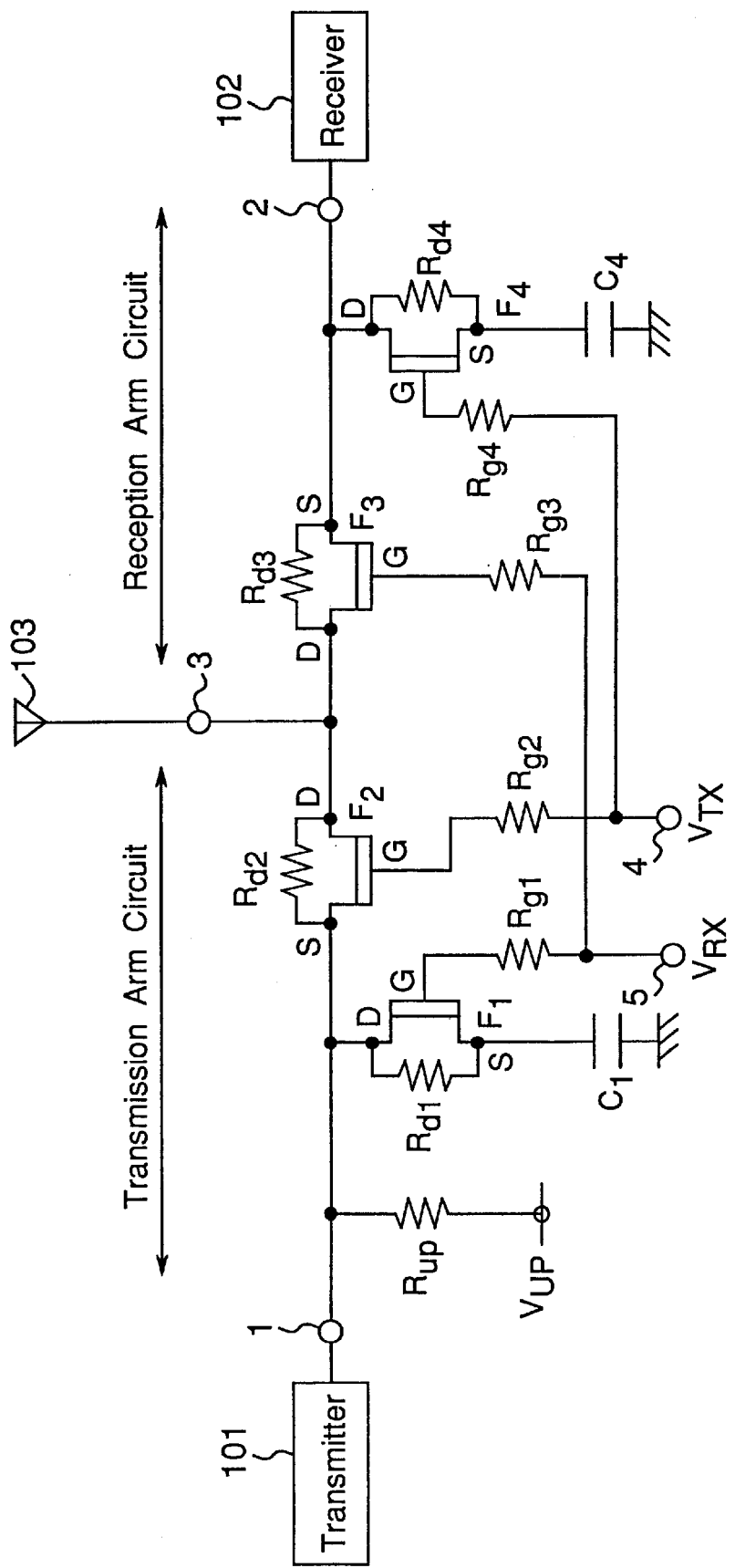
FIG. 11 is a circuit diagram showing a constitution of a duplexer circuit of the prior art.

FIG. 1 is a circuit diagram showing a constitution of a duplexer circuit according to a first preferred embodiment of the present invention. In FIG. 1, components similar to those shown in FIG. 11 and FIG. 12 are denoted by the same reference numerals.

Figure 12:
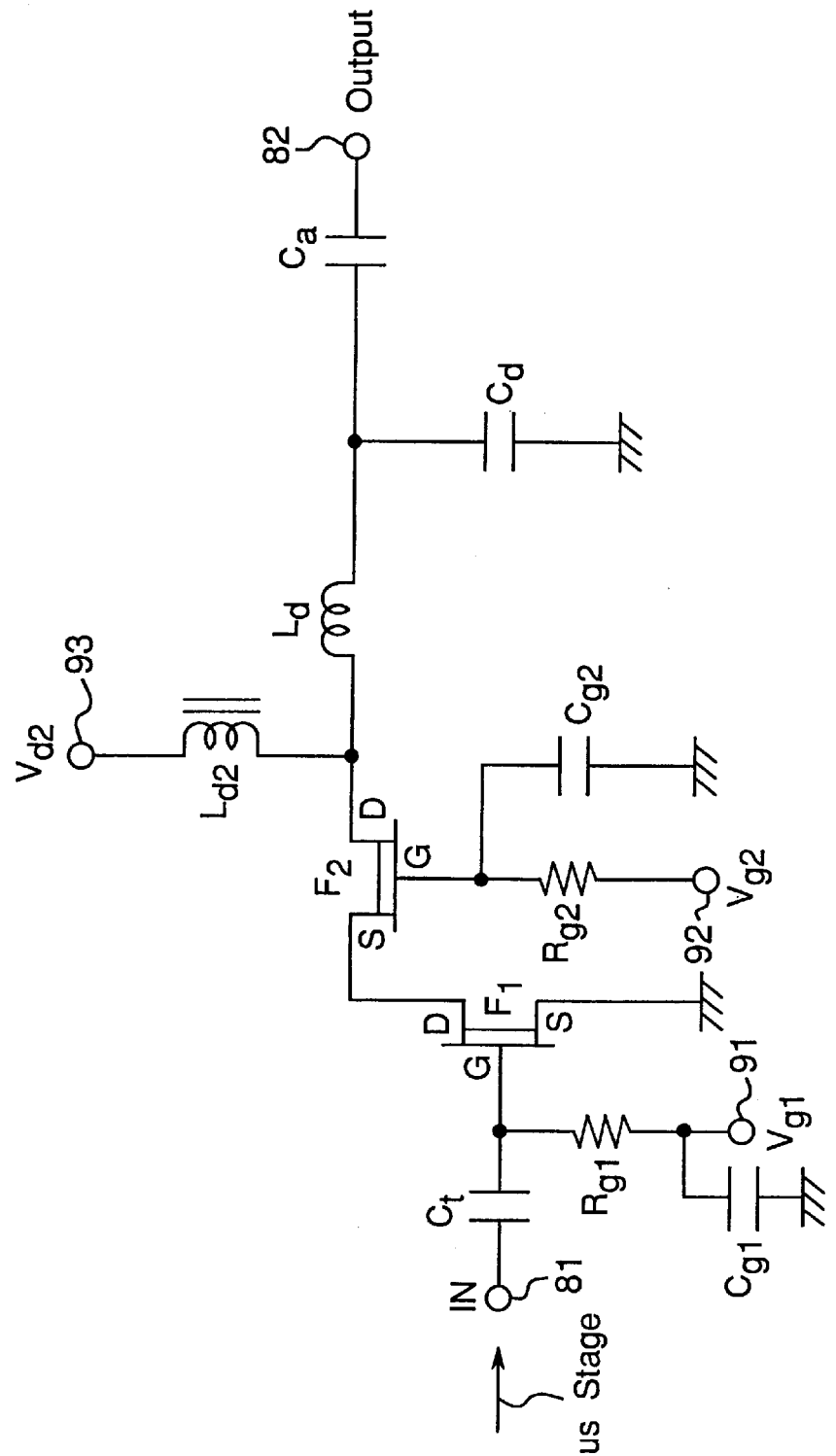
FIG. 12 is a circuit diagram showing a constitution of a cascode power amplifier of the prior art.

The duplexer circuit of the present preferred embodiment is characterized in that the cascode power amplifier shown in FIG. 12 and an impedance matching inductor $L_d$ are inserted into a transmission arm circuit located between a transmitter connecting terminal 1 and an antenna connecting terminal 3.

Referring to FIG. 1, the transmission arm circuit located between the terminal 1 and the terminal 3 comprises a first switching circuit that is turned on during transmission and is turned off during reception, while the reception arm circuit located between the terminal 2 and the terminal 3 comprises a second switching circuit that is turned off during transmission and is turned on during reception. In this case, the first switching circuit is constituted by a cascode power amplifier, while the second switching circuit is constituted by the reception arm circuit of the prior art.

The reference numerals FETs $F_1$ to $F_4$ denote depletion type FETs, while the reference numerals $R_{d2}$, $R_{d3}$ and $R_{d4}$ denote resistors having a resistance of an order of kilo-ohms, and the resistors $R_{d2}$, $R_{d3}$ and $R_{d4}$ are connected between the drains and sources of the FETs $F_2$, $F_3$ and $F_4$, respectively, so as to make the drain and source of each of the FETs $F_2$, $F_3$ and $F_4$ have equivalent electric potentials or voltages to each other. The reference numerals $R_{g1}$, $R_{g2}$, $R_{g3}$ and $R_{g4}$ denote gate voltage applying resistors, each having a resistance of an order of kilo-ohms for applying a gate voltage to the gate of each of the FETs $F_1$ to $F_4$, while the reference numerals $C_1$ and $C_2$ are high-frequency by-pass capacitors, the reference numeral $C_4$ denotes a capacitor for grounding the source of the FET $F_4$ in terms of high frequency. The reference symbol $L_d$ denotes an impedance matching inductor for achieving impedance matching of the output stage of the cascode power amplifier with the antenna 103. The reference numerals $C_t$, $C_a$ and $C_r$ denote high-frequency coupling capacitors, while the reference numeral $L_{d2}$ denotes a high-frequency blocking inductor for power supply. Further, the reference numeral $V_{d2}$ denotes a power source, while the reference numerals $V_{g1}$ to $V_{g4}$ denote the gate voltages of the FETs $F_1$ to $F_4$, respectively. Further, one end of the capacitor $C_r$ is connected to the receiver connecting terminal 2, and another end thereof is connected to a pull-up voltage $V_{UP}$ via a pull-up resistor $R_{UP}$ having a resistance having an order of kilo-ohms for pulling up the electric potential or voltage of the transmission arm circuit located between the transmitter connecting terminal 1 and the antenna connecting terminal 3 as well as the electric potential or voltage of the reception arm circuit located between the terminals 2 and 3, thereby allowing the duplexer circuit to be controlled by a control voltage having a positive voltage or a zero voltage.

In the transmission arm circuit shown in FIG. 1, the transmitter connecting terminal 1 to which a transmitter 101 is connected is connected to the gate of the source-grounded FET $F_1$ via the coupling capacitor $C_t$, and the gate is connected to a gate voltage applying terminal 11 via the gate voltage applying resistor $R_{g1}$. The terminal 11 is grounded via a high-frequency by-pass capacitor C1. The drain of the FET $F_1$ is connected to a connecting point 4 via the source and drain of the FET $F_2$, a connecting point 5 and the impedance matching inductance $L_d$, and the connecting point 4 is connected via a coupling capacitor $C_a$ to the antenna connecting terminal 3 to which the antenna 103 is connected. The gate of the FET $F_2$ is connected to a gate voltage applying terminal 12 via the gate voltage applying resistor $R_{g2}$, and the gate thereof is grounded in terms of high frequency via a high-frequency by-pass capacitor $C_2$. In this case, the connecting point 5 located between the drain of the FET $F_2$ and the inductor $L_d$ is connected to a power source voltage applying terminal 22 via a high-frequency blocking inductor $L_{d2}$.

On the other hand, in the reception arm circuit shown in FIG. 1, the connecting point 4 is connected via the drain and source of the FET $F_3$, a connecting point 6 and a coupling capacitor $C_r$ to the receiver connecting terminal 2 to which the receiver 102 is connected. In this case, the gate of the FET $F_3$ is connected via the gate voltage applying resistor $R_{g3}$ to a gate voltage applying terminal 13, while the gate of the FET $F_4$ is connected via the gate voltage applying resistor $R_{g4}$ to a gate voltage applying terminal 14. The connecting point 6 is grounded via the drain and source of the FET $F_4$ and a coupling capacitor $C_4$. The connecting point 6 is connected via the pull-up resistor $R_{UP}$ to a power source for supplying the pull-up voltage $V_{UP}$.

Table 2 shows the pull-up voltage $V_{UP}$ and the voltages to be applied to the gate voltage applying terminals 11 to 14 in the transmission mode and the reception mode of the duplexer circuit. The reference symbol $V_{dd}$ denotes a power source, and the reference symbols $V_{ga}$ and $V_{gb}$ are gate voltages required for operating each of the FETs $F_1$ and FET $F_2$ as a voltage amplifier, where they satisfy $V_P < V_{ga} < 0$ V and $V_P < V_{gb} < 0$ V in this case. It is assumed that the pinch-off voltage $V_P$ of each of the FETs $F_1$ and $F_2$ is smaller than the power source voltage $V_{dd}$. These conditions are set in a manner to that similar to that of the preferred embodiments described later.

TABLE 2

| | First Preferred embodiment | | | | |
|---|---|---|---|---|---|
| | $V_{UP}$ | $V_{g1}$ | $V_{g2}$ | $V_{g3}$ | $V_{g4}$ |
| Transmission Mode | $V_{dd}$ | $V_{ga}$ | $V_{gb}$ | 0 V | $V_{dd}$ |
| Reception Mode | $V_{dd}$ | $V_{ga}$ | 0 V | $V_{dd}$ | 0 V |

In FIG. 1, the FET $F_1$ and FET $F_2$ constitute a cascode voltage amplifier, which operates as the output stage of the power amplifier. As a result, a power loss in the transmission arm circuit of the first prior art shown in FIG. 11 becomes substantially zero, so that the insertion loss in the switching circuits is reduced. In this case, an inductance $L_{d3}$ between the source and drain of the FET $F_3$ and the gate width of the FET $F_3$ are determined and set so that the output impedance matching of the power amplifier can be achieved by the inductor $L_d$ having an inductance of an order of nanohenries and an OFF-state capacitance $C_3$ of an order of picofarads of the FET $F_3$. One end of the OFF-state capacitance $C_3$ is grounded in terms of high frequency by turning on the FET $F_4$, and therefore, the OFF-state capacitance $C_3$ operates just like the capacitor $C_d$ shown in FIG. 12.

During reception, the gate voltage $V_{g2}$ is set to 0 V, thereby turning off the FET $F_2$. Further, by turning on the FET $F_3$ and turning off the FET $F_4$, the high-frequency signal received by the antenna 103 is transmitted via the FETs $F_3$ and $F_4$ to the receiver 102 and scarcely appears at the terminal 1.

As described above, according to the first preferred embodiment, by incorporating the cascode power amplifier into the transmission arm circuit of the duplexer circuit, the chip size can be remarkably reduced in the chip obtained by integrating the power amplifier with the duplexer circuit, and the insertion loss during transmission of the duplexer circuit can be reduced.

Second Preferred Embodiment

Figure 2:
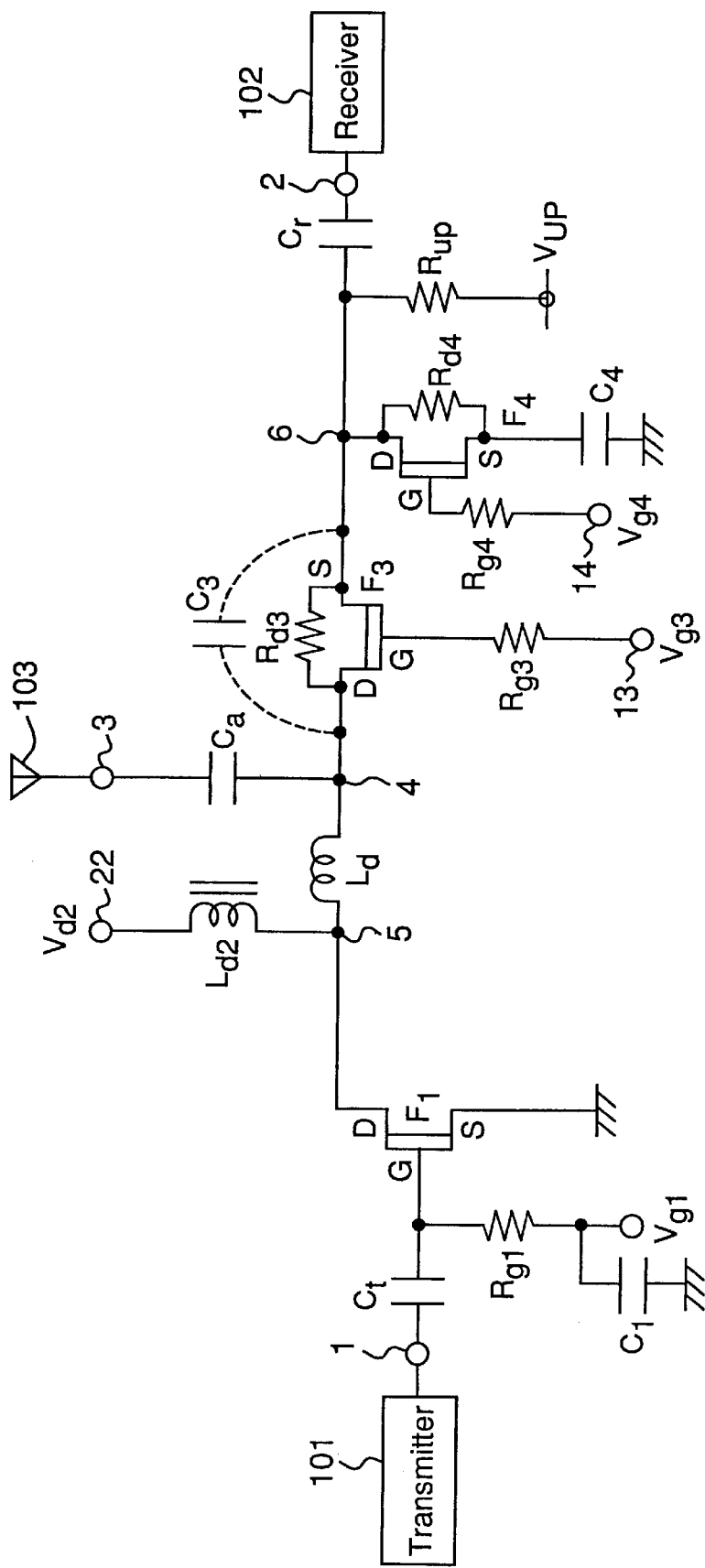
FIG. 2 is a circuit diagram showing a constitution of a duplexer circuit according to a second preferred embodiment of the present invention.

FIG. 2 is a circuit diagram showing a constitution of a duplexer circuit according to a second preferred embodiment of the present invention. The second preferred embodiment is characterized in that, in the first preferred embodiment shown in FIG. 1, the gate-grounded FET $F_2$ and its peripheral circuit (resistor $R_{d2}$, resistor $R_{g2}$ and capacitor $C_2$) are removed and the transmission arm circuit is provided with a source-grounded type amplifier constituted by the FET $F_1$.

In the duplexer circuit of the second preferred embodiment constituted as above, the isolation between the antenna 103 and the transmitter 101 during reception is reduced as compared with that of the constitution of the first preferred embodiment shown in FIG. 1, however, the present circuit has such an advantageous effect that the present circuit can be compacted further than the constitution of the first preferred embodiment.

Table 3 shows the pull-up voltage $V_{UP}$ and the voltages to be applied to the gate voltage applying terminals 11, 13 and 14 in the transmission mode and the reception mode of the duplexer circuit. As shown in Table 3, it is required to completely put the FET $F_1$ into the pinch-off stage by setting the gate voltage $V_{g1}$ to a specified gate voltage $V_{gp}$ lower than the pinch-off voltage $V_p$ of the FET $F_1$ during reception.

TABLE 3

Second Preferred embodiment

|  | $V_{UP}$ | $V_{g1}$ | — | $V_{g3}$ | $V_{g4}$ |
|---|---|---|---|---|---|
| Transmission Mode | $V_{dd}$ | $V_{ga}$ | — | 0 V | $V_{dd}$ |
| Reception Mode | $V_{dd}$ | $V_{gp}$ | — | $V_{dd}$ | 0 V |

As described above, according to the second preferred embodiment, by incorporating the cascode power amplifier, from which the gate-grounded FET $F_2$ and its peripheral circuit are removed, i.e., the source-grounded type amplifier of the FET $F_1$, into the transmission arm circuit of the duplexer circuit, the chip size can be remarkably reduced in the chip obtained by integrating the power amplifier with the duplexer circuit, and the insertion loss during transmission of the duplexer circuit can be reduced.

Third Preferred Embodiment

Figure 3:
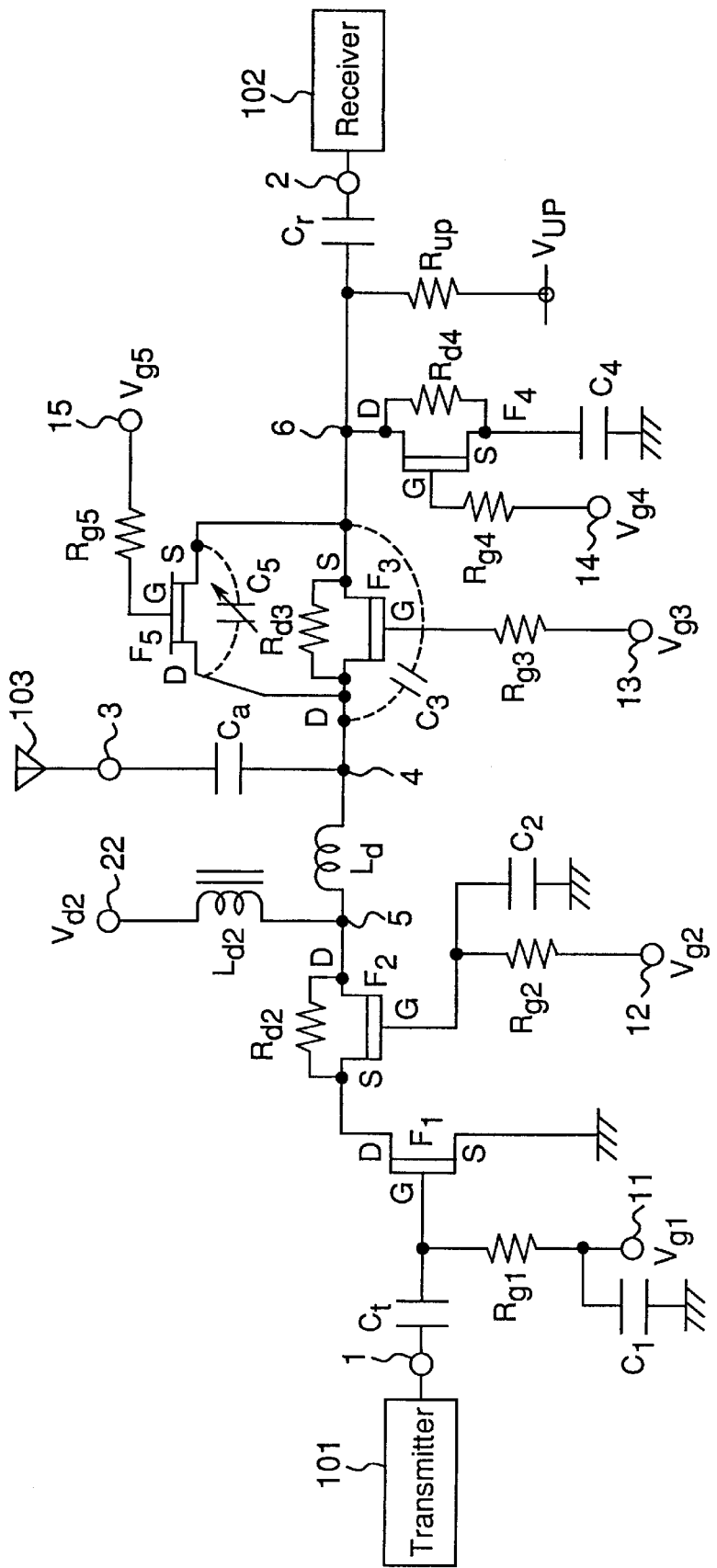
FIG. 3 is a circuit diagram showing a constitution of a duplexer circuit according to a third preferred embodiment of the present invention.

FIG. 3 is a circuit diagram showing a constitution of a duplexer circuit according to a third preferred embodiment of the present invention. The third preferred embodiment is based on and characterized in that, in the first preferred embodiment shown in FIG. 1, the source and drain of an FET $F_5$ are connected in parallel with the source and drain of the FET $F_3$, respectively, and the gate of the FET $F_5$ is connected via a gate voltage applying resistor $R_{g5}$ to a gate voltage applying terminal 15.

In the duplexer circuit shown in FIG. 3, by changing a gate voltage $V_{g5}$, an OFF-state capacitance $C_5$ of the FET $F_5$ can be controlled. In general, the OFF-state capacitance of an FET is often smaller than the capacitance required for the matching of the power amplifier, and the electrostatic capacity of the OFF-state capacitance $C_3$ for impedance matching can be increased, and then, the impedance matching of the FET $F_1$ and FET $F_2$ having a large gate width for a large output can be easily achieved. With setting in an impedance-matched state, there can be set either (a) a power-matched state in which the impedance matching is achieved for obtaining a greater power or (b) an efficiency-matched state in which the impedance matching is achieved for obtaining a greater efficiency.

Table 4 shows the pull-up voltage $V_{UP}$ and the voltages to be applied to the gate voltage applying terminals 11 to 15 in the transmission mode and the reception mode of the duplexer circuit.

TABLE 4

Third Preferred embodiment

|  | $V_{UP}$ | $V_{g1}$ | $V_{g2}$ | $V_{g3}$ | $V_{g4}$ | $V_{g5}$ |
|---|---|---|---|---|---|---|
| Transmission Mode | $V_{dd}$ | $V_{ga}$ | $V_{gb}$ | 0 V | $V_{dd}$ | Equal to or Smaller than $V_{gp}$ |
| Reception Mode | $V_{dd}$ | $V_{ga}$ | 0 V | $V_{dd}$ | 0 V | $V_{dd}$ or Equal to or Smaller than $V_{gp}$ |

As described above, according to the third preferred embodiment, by incorporating the cascode power amplifier into the transmission arm circuit of the duplexer circuit, the chip size can be remarkably reduced in the chip obtained by integrating the power amplifier with the duplexer circuit, and the insertion loss during transmission of the duplexer circuit can be reduced. Furthermore, the impedance matching of the antenna 103 with the receiver 102 can be more easily achieved.

Although the two FETs $F_3$ and $F_5$ are connected in parallel with each other in the above-mentioned third preferred embodiment, the present invention is not limited to this, and a plurality of FETs may be connected in parallel with the FET $F_3$.

Fourth Preferred Embodiment

Figure 4:
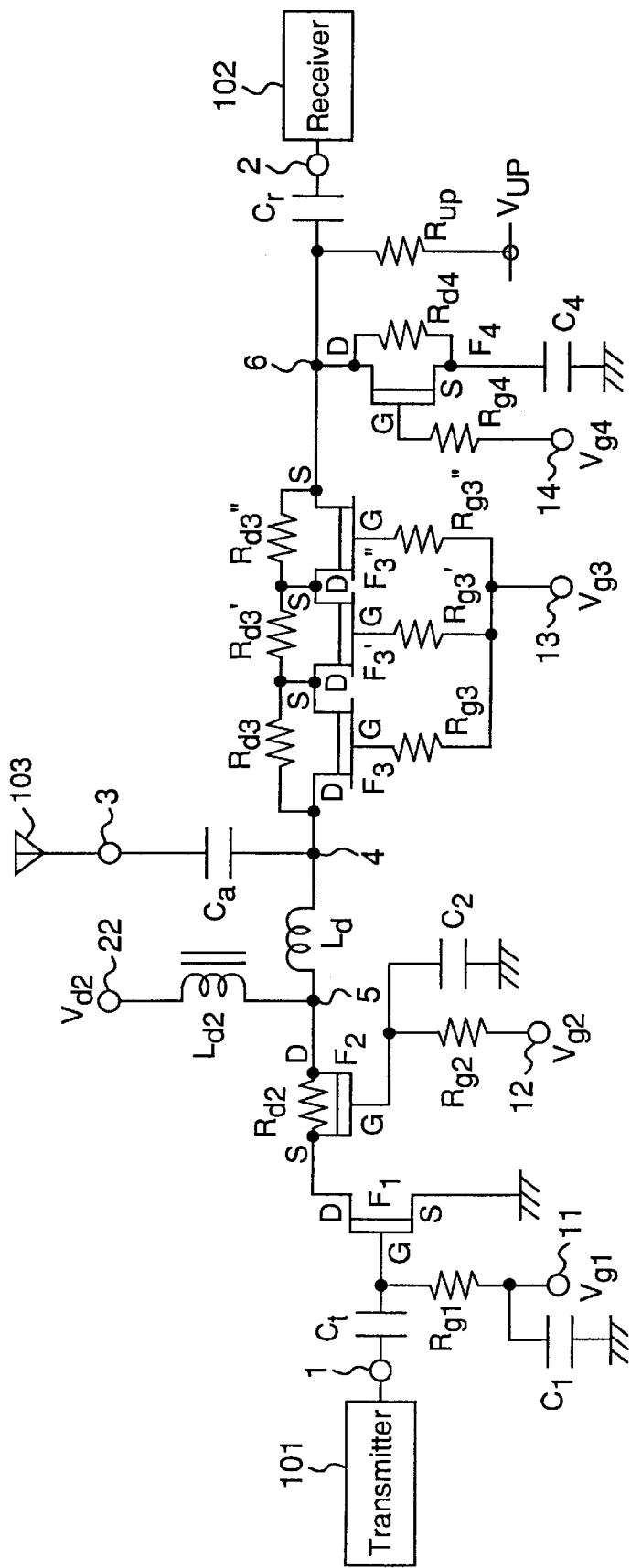
FIG. 4 is a circuit diagram showing a constitution of a duplexer circuit according to a fourth preferred embodiment of the present invention.

FIG. 4 is a circuit diagram showing a constitution of a duplexer circuit according to a fourth preferred embodiment of the present invention. The fourth preferred embodiment is characterized in that, in the first preferred embodiment shown in FIG. 1, a series connection circuit constituted by the three FETs of FET $F_3$, FET $F_3'$ and FET $F_3''$ is inserted in place of the FET $F_3$. In this case, the connecting point 4 is connected to the connecting point 6 via the drain and source of the FET $F_3$, the drain and source of the FET $F_3'$ and the drain and source of the FET $F_3''$, and further, the gates of the FETs $F_3$, $F_3'$ and $F_3''$ are connected to the gate voltage applying terminal 13 via resistors $R_{g3}$, $R_{g3}'$ and $R_{g3}''$, respectively. It is to be noted that resistors $R_{d3}$, $R_{d3}'$ and $R_{d3}''$ are the resistors connected across the source and drain for the provision of an equal potential or voltage across the source and drain of each of the FETs $F_3$, $F_3'$ and $F_3''$.

Table 5 shows the pull-up voltage $V_{UP}$ and the voltages to be applied to the gate voltage applying terminals 11 to 14 in the transmission mode and the reception mode of the duplexer circuit.

TABLE 5

Fourth Preferred embodiment

|  | $V_{UP}$ | $V_{g1}$ | $V_{g2}$ | $V_{g3}$ | $V_{g4}$ |
|---|---|---|---|---|---|
| Transmission Mode | $V_{dd}$ | $V_{ga}$ | $V_{gb}$ | 0 V | $V_{dd}$ |
| Reception Mode | $V_{dd}$ | $V_{ga}$ | 0 V | $V_{dd}$ | 0 V |

In general, a transmission signal power handling capability (this means the capability of the duplexer circuit with regard to the magnitude of the transmission signal power that can be transmitted by the duplexer circuit) P of the duplexer circuit is expressed by the following equation:

$$P=2N^2(V_c+V_p)^2/Z_0 \qquad (1).$$

In this equation (1), Vp is the pinch-off voltage (<0 V) of the FET ($F_3$, $F_3'$ and $F_3''$ in the present preferred embodiment), Vc is a control voltage for controlling the gate of the FET ($F_3$, $F_3'$ and $F_3''$ in the present preferred embodiment) in the OFF-state, and N is the number of stages of the series connection of the FET ($F_3$, $F_3'$ and $F_3''$ in the present preferred embodiment) in the OFF-state, where the number N is set to that N=3 in the present preferred embodiment. Further, $Z_0$ is the characteristic impedance of the system.

As is apparent from Equation (1), by increasing the number N of stages of the series connection of the FETs in the OFF-state, the transmissible power P of the transmission signal increases. It is to be noted that the increase in the number N causes an increase in the insertion loss of the FETs $F_3$, $F_3'$ and $F_3''$ during reception, and therefore, the value of the number N is determined on a trade-off basis.

As described above, according to the fourth preferred embodiment, by incorporating the cascode power amplifier into the transmission arm circuit of the duplexer circuit, the chip size can be remarkably reduced in the chip obtained by integrating the power amplifier with the duplexer circuit, and the insertion loss during transmission of the duplexer circuit can be reduced. Furthermore, since the number N of stages of the series connection of the FETs in the OFF-state is increased as compared with that of the first preferred embodiment, the transmissible power P of the transmission signal can be increased.

Although the number N of stages of the series connection of the FETs in the OFF-state is set to that N=3 in the above-mentioned fourth preferred embodiment, the present invention is not limited to this, and the number N may be an integer of 2, or equal to or greater than 4.

Fifth Preferred Embodiment

Figure 5:
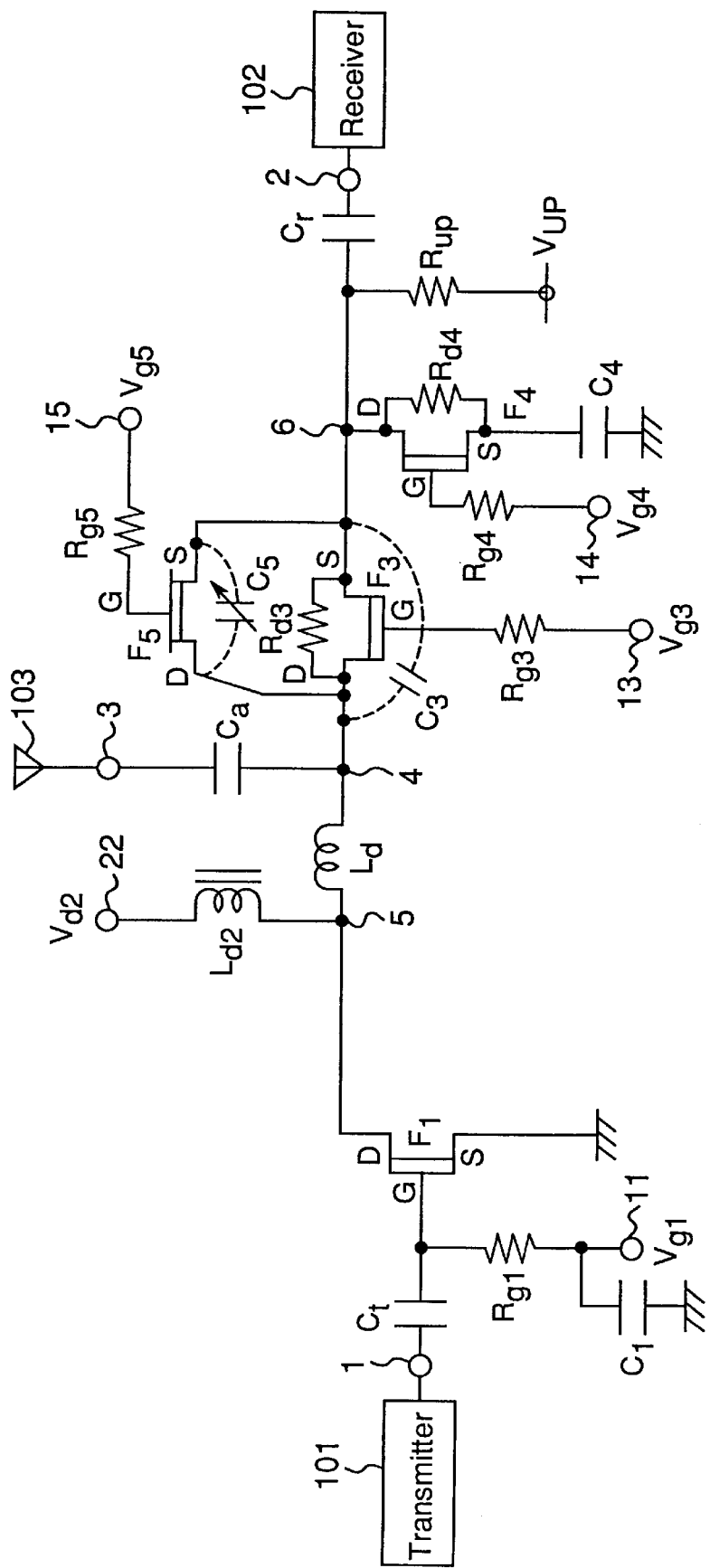
FIG. 5 is a circuit diagram showing a constitution of a duplexer circuit according to a fifth preferred embodiment of the present invention.

FIG. 5 is a circuit diagram showing a constitution of a duplexer circuit according to a fifth preferred embodiment of the present invention. This fifth preferred embodiment is a combination of the feature of the second preferred embodiment shown in FIG. 2 and the feature of the third preferred embodiment shown in FIG. 3. The fifth preferred embodiment is characterized in that, in the second preferred embodiment, the source and drain of the FET $F_5$ are connected in parallel with the source and drain of the FET $F_3$, respectively, and the gate of the FET $F_5$ is connected via the gate voltage applying resistor $R_{g5}$ to the gate voltage applying terminal 15.

According to the fifth preferred embodiment having the above-mentioned constitution, by incorporating the source-grounded type amplifier, which is the cascode power amplifier from which the gate-grounded FET $F_2$ and its peripheral circuit are removed, into the transmission arm circuit of the duplexer circuit, the chip size can be remarkably reduced in the chip obtained by integrating the power amplifier with the duplexer circuit, and the insertion loss during transmission of the duplexer circuit can be reduced. Furthermore, the impedance matching of the antenna 103 with the receiver 102 can be more easily achieved.

Although the two FETs $F_3$ and $F_5$ are connected in parallel with each other in the above-mentioned fifth preferred embodiment, the present invention is not limited to this, and a plurality of FETs may be connected in parallel with the FET $F_3$.

Sixth Preferred Embodiment

Figure 6:
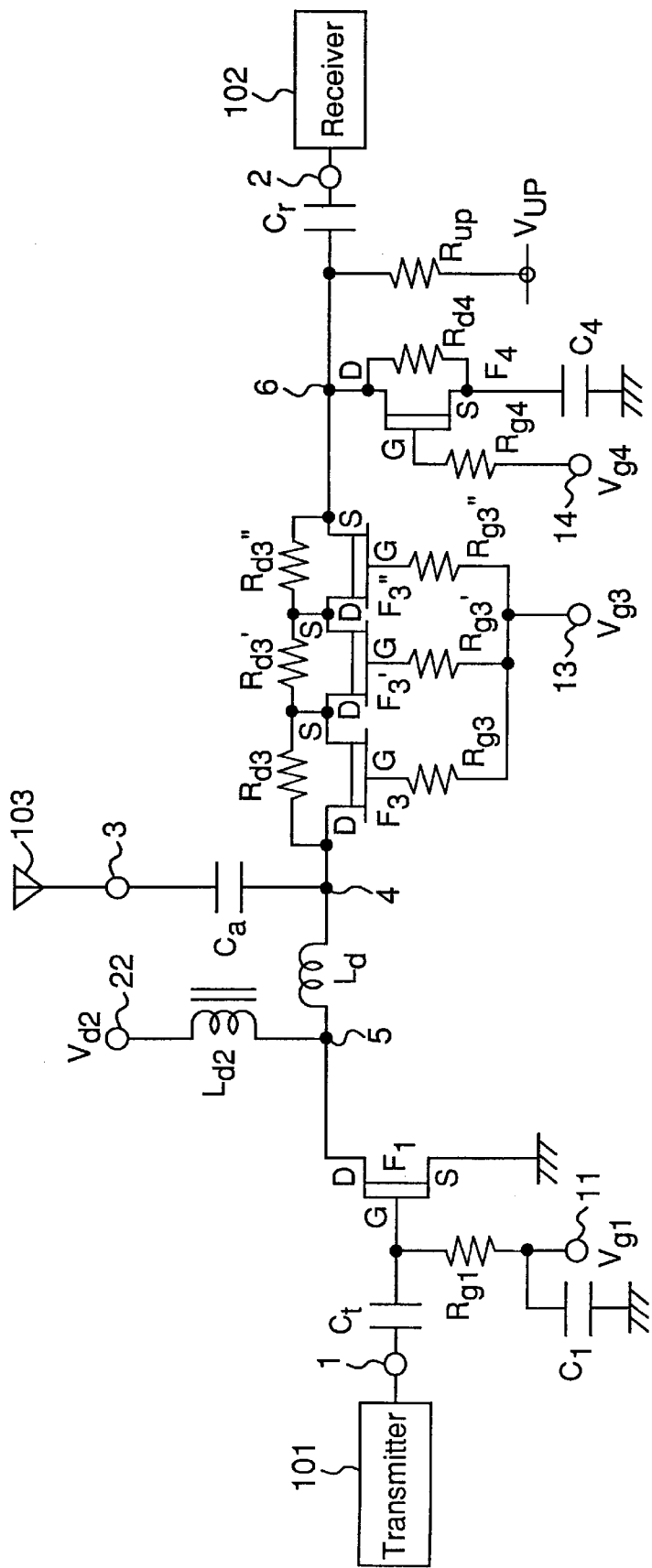
FIG. 6 is a circuit diagram showing a constitution of a duplexer circuit according to a sixth preferred embodiment of the present invention.

FIG. 6 is a circuit diagram showing a constitution of a duplexer circuit according to a sixth preferred embodiment of the present invention. The sixth preferred embodiment is a combination of the feature of the second preferred embodiment shown in FIG. 2 and the feature of the fourth preferred embodiment shown in FIG. 4. The sixth preferred embodiment is characterized in that, in the second preferred embodiment shown in FIG. 2, a series connection circuit constituted by the three FETs of FET $F_3$, FET $F_3'$ and FET $F_3''$ is inserted in place of the FET $F_3$.

As described above, according to the sixth preferred embodiment, by incorporating the source-grounded type amplifier, which is the cascode power amplifier from which the gate-grounded FET $F_2$ and its peripheral circuit are removed, into the transmission arm circuit of the duplexer circuit, the chip size can be remarkably reduced in the chip obtained by integrating the power amplifier with the duplexer circuit, and the insertion loss during transmission of the duplexer circuit can be reduced. Furthermore, since the number N of stages of the series connection of the FETs in the OFF-state is increased as compared with those of the first and second preferred embodiments, the transmissible power P of the transmission signal can be increased.

Seventh Preferred Embodiment

Figure 7:
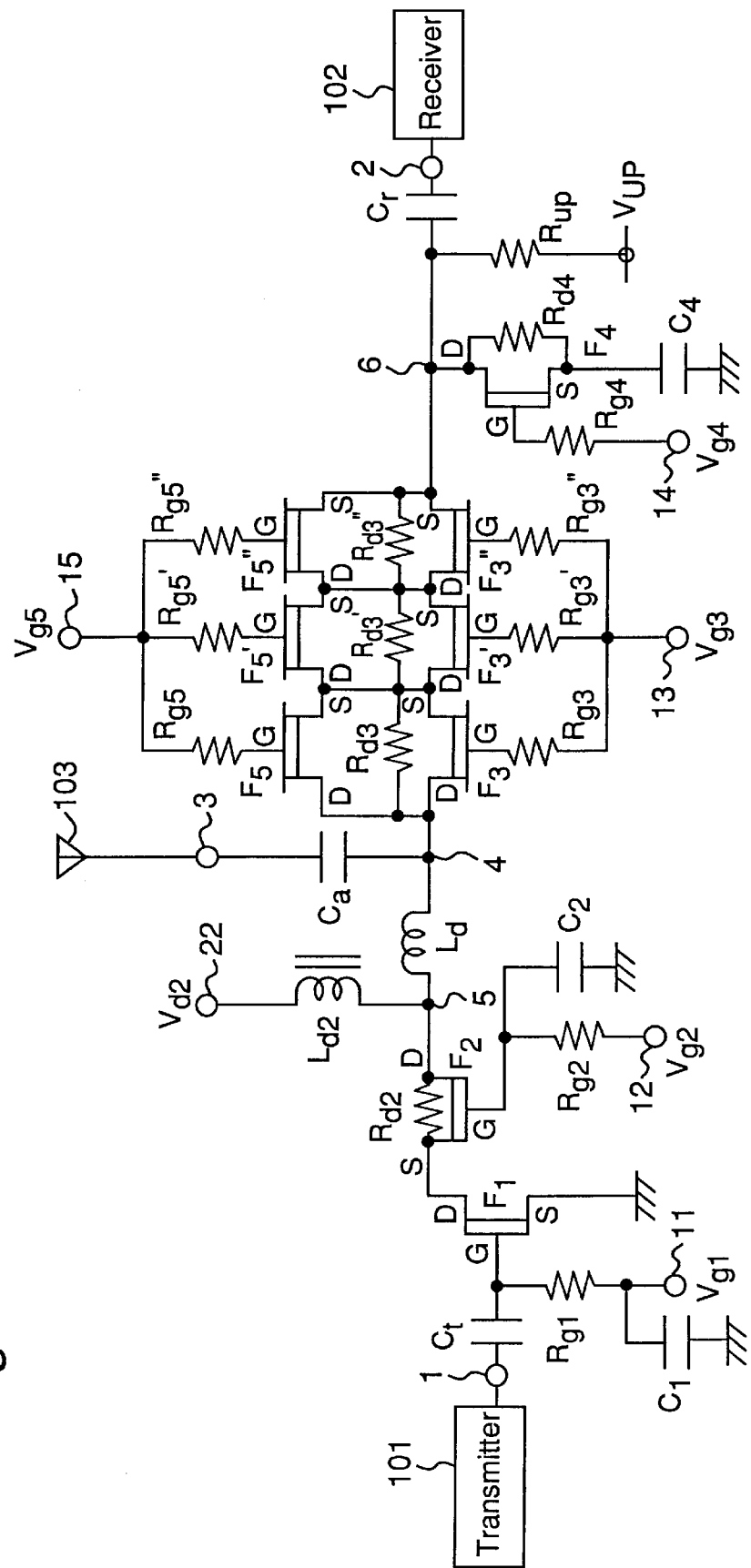
FIG. 7 is a circuit diagram showing a constitution of a duplexer circuit according to a seventh preferred embodiment of the present invention.

FIG. 7 is a circuit diagram showing a constitution of a duplexer circuit according to a seventh preferred embodiment of the present invention. The seventh preferred embodiment is a combination of the feature of the third preferred embodiment shown in FIG. 3 and the feature of the fourth preferred embodiment shown in FIG. 4. The seventh preferred embodiment is characterized in that, in the third preferred embodiment shown in FIG. 3, a series connection circuit constituted by the three FETs of FET $F_3$, FET $F_3'$ and FET $F_3''$ is inserted in place of the FET $F_3$, and a series connection circuit constituted by the three FETs of FET $F_5$, FET $F_5'$ and FET $F_5''$ are inserted in place of the FET $F_5$.

In FIG. 7, the connecting point 4 is connected to the connecting point 6 via the drain and source of the FET $F_5$, the drain and source of the FET $F_5'$ and the drain and source of the FET $F_5''$, and the gates of the FETs $F_5$, $F_5'$ and $F_5''$ are connected to the gate voltage applying terminal 15 via the resistors $R_{g5}$, $R_{g5}'$ and $R_{g5}''$. It is to be noted that the resistors $R_{d5}$, $R_{d5}'$ and $R_{d5}''$ are the resistors connected across the source and drain for the provision of an equal potential or voltage across the source and drain of each of the FETs $F_5$, $F_5'$ and $F_5''$. It is to be noted that the series connection circuit of the three FETs of FET $F_3$, FET $F_3'$ and FET $F_3''$ is constituted in a manner similar to that of the third preferred embodiment shown in FIG. 3.

As described above, according to the seventh preferred embodiment, by incorporating the cascode power amplifier into the transmission arm circuit of the duplexer circuit, the chip size can be remarkably reduced in the chip obtained by integrating the power amplifier with the duplexer circuit, and the insertion loss during transmission of the duplexer circuit can be reduced. Furthermore, the impedance matching of the antenna 103 with the receiver 102 can be more easily achieved. Furthermore, since the number N of stages of the series connection of the FETs in the OFF-state is increased as compared with that of the first preferred embodiment, the transmissible power P of the transmission signal can be increased.

Although there are provided parallel connections of the two FETs $F_3$ and $F_5$, the two FETs $F_3'$ and $F_5'$ and the two FETs $F_3''$ and $F_5''$ in the above-mentioned seventh preferred embodiment, the present invention is not limited to this, and a plurality of FETs may be connected in parallel with the FETs $F_3$, $F_3'$ and $F_3''$.

Eighth Preferred Embodiment

Figure 8:
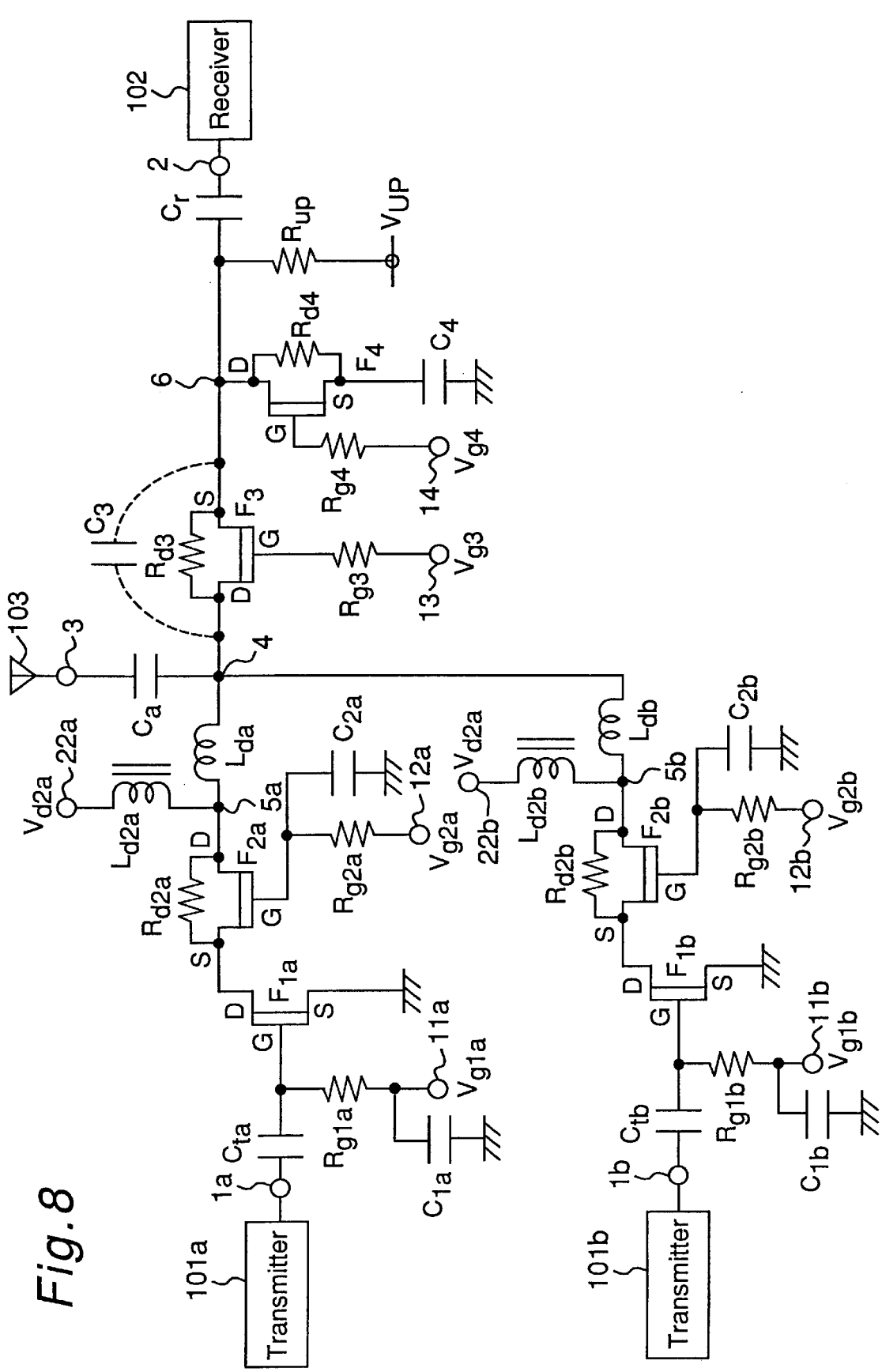
FIG. 8 is a circuit diagram showing a constitution of a duplexer circuit according to an eighth preferred embodiment of the present invention.

FIG. 8 is a circuit diagram showing a constitution of a duplexer circuit according to an eighth preferred embodiment of the present invention. The eighth preferred embodiment is characterized in including two pairs of transmission arm circuits shown in FIG. 1 and these two pairs of first and second transmission arm circuits are connected to the connecting point 4. In this case, a suffix "a" is attached to the reference numerals of respective terminals and respective elements in the first transmission arm circuit, while a suffix "b" is attached to the reference numerals of respective terminals and respective elements in the second transmission arm circuit. In this case, a transmitter 101a is connected to a transmitter connecting terminal 1a, and the terminal 1a is connected to the connecting point 4 via a coupling capacitor $C_{ta}$, an FET $F_{1a}$, an FET $F_{2a}$, a connecting point 5a and an impedance matching inductor $L_{da}$. A transmitter 101b is connected to a transmitter connecting terminal 1b, and the terminal 1b is connected to the connecting point 4 via a coupling capacitor $C_{tb}$, an FET $F_{1b}$, an FET $F_{2b}$, a connecting point 5b and an impedance matching inductor $L_{db}$.

Table 6 shows the pull-up voltage $V_{UP}$ and voltages to be applied to gate voltage applying terminals 11a, 11b, 12a, 12b, 13 and 14 in the transmission mode and the reception mode of the duplexer circuit.

TABLE 6

| | Eighth Preferred embodiment | | | | | |
|---|---|---|---|---|---|---|
| | $V_{UP}$ | $V_{g1a}$ $V_{g1b}$ | $V_{g2a}$ $V_{g2b}$ | $V_{g3}$ | $V_{g4}$ | $V_{d2a}$ $V_{d2b}$ |
| Transmission Mode | $V_{dd}$ | $V_{ga}$ | $V_{gb}$ | 0 V | | $V_{dd}$ |
| Reception Mode | $V_{dd}$ | $V_{ga}$ | 0 V | $V_{dd}$ | 0 V | $V_{dd}$ |

In the duplexer circuit shown in FIG. 8, for the purpose of putting only the transmitter 101a into a transmitting state and connecting the same to the antenna 103, it is preferable to apply a gate voltage $V_{gb}$ to only a terminal 12a and make a terminal 12b have the ground potential or voltage. For the purpose of putting only the transmitter 101b into the transmitting state and connecting the same to the antenna 103, it is preferable to apply a gate voltage $V_{gb}$ to only the terminal 12b and make the terminal 12a have the ground potential or voltage. With this arrangement, either the transmitter 101a or the transmitter 101b can be selectively switched to be put into the transmitting state.

As described above, according to the eighth preferred embodiment, by incorporating the cascode power amplifier into the transmission arm circuit of the duplexer circuit, the chip size can be remarkably reduced in the chip obtained by integrating the power amplifier with the duplexer circuit, and the insertion loss during transmission of the duplexer circuit can be reduced. Furthermore, by incorporating the two cascode power amplifiers into the duplexer circuit, there can be provided a compact duplexer circuit which can be applied to a system of two different frequencies like, for example, a so-called dual-band transceiver.

Although the two transmitters 101a and 101b are connected in the eighth preferred embodiment, the present invention is not limited to this, and it is acceptable to provide three or more plurality of pairs of transmission arm circuits shown in FIG. 1 and connect these plurality of pairs of transmission arm circuits to the connecting point 4.

Ninth Preferred Embodiment

Figure 9:
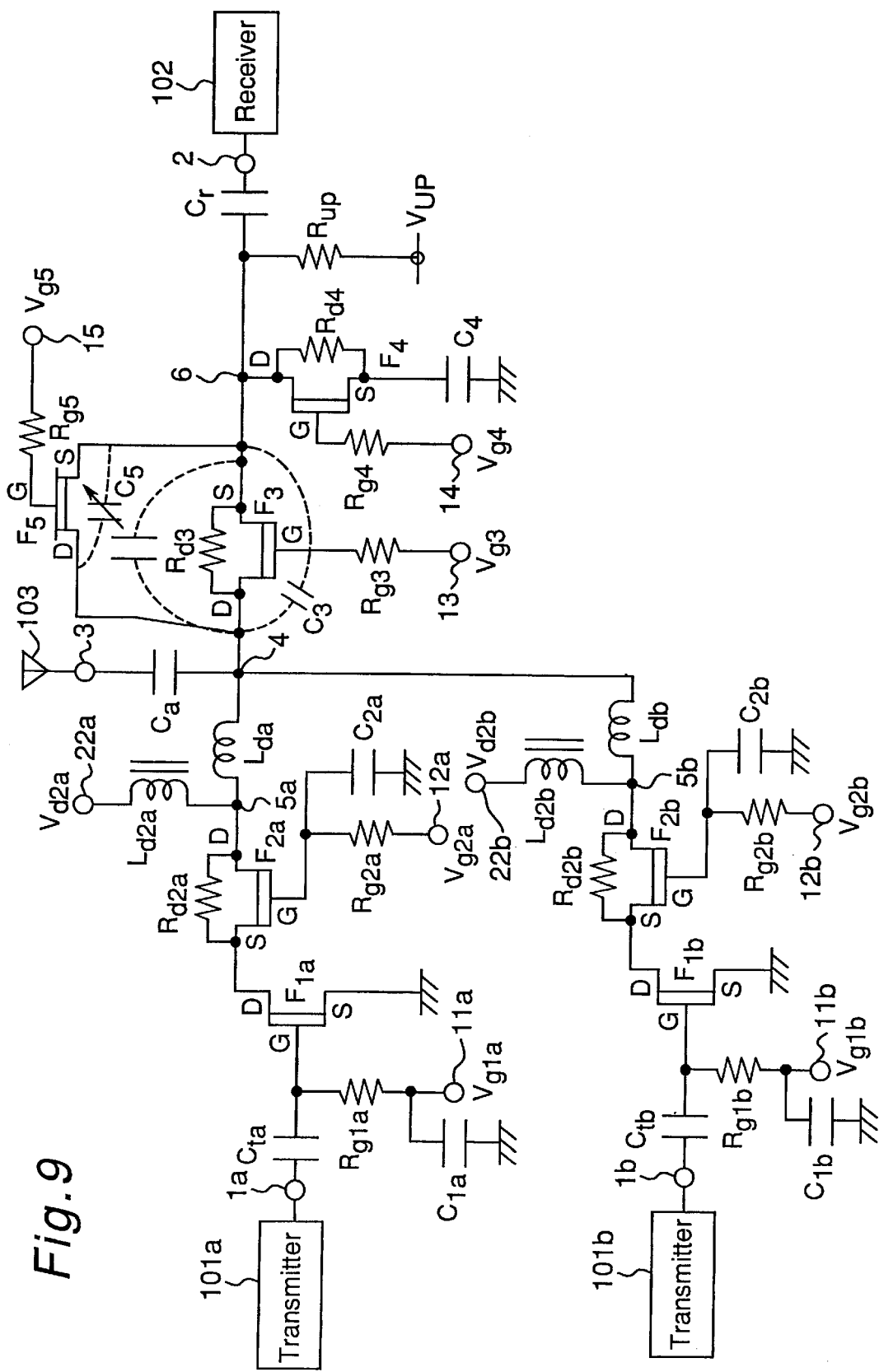
FIG. 9 is a circuit diagram showing a constitution of a duplexer circuit according to a ninth preferred embodiment of the present invention.

FIG. 9 is a circuit diagram showing a constitution of a duplexer circuit according to a ninth preferred embodiment of the present invention. The ninth preferred embodiment is a combination of the feature of the eighth preferred embodiment shown in FIG. 8 and the feature of the third preferred embodiment shown in FIG. 3. The ninth preferred embodiment is characterized in that, in the eighth preferred embodiment, the source and drain of the FET $F_5$ are connected in parallel with the source and drain of the FET $F_3$, and the gate of the FET $F_5$ is connected via the gate voltage applying resistor $R_{g5}$ to the gate voltage applying terminal 15.

As described above, according to the ninth preferred embodiment, by incorporating the cascode power amplifier into the transmission arm circuit of the duplexer circuit, the chip size can be remarkably reduced in the chip obtained by integrating the power amplifier with the duplexer circuit, and the insertion loss during transmission of the duplexer circuit can be reduced. Furthermore, by incorporating the two cascode power amplifiers into the duplexer circuit, there can be provided a compact duplexer circuit which can be applied to a system of two different frequencies like, for example, the so-called dual-band transceiver. Furthermore, the impedance matching of the antenna 103 with the receiver 102 can be more easily achieved.

Although the two transmitters 101a and 101b are connected in the ninth preferred embodiment, the present invention is not limited to this, and it is acceptable to provide three or more plurality of pairs of transmission arm circuits shown in FIG. 1 and connect these plurality of pairs of transmission arm circuits to the connecting point 4.

Tenth Preferred Embodiment

Figure 10:
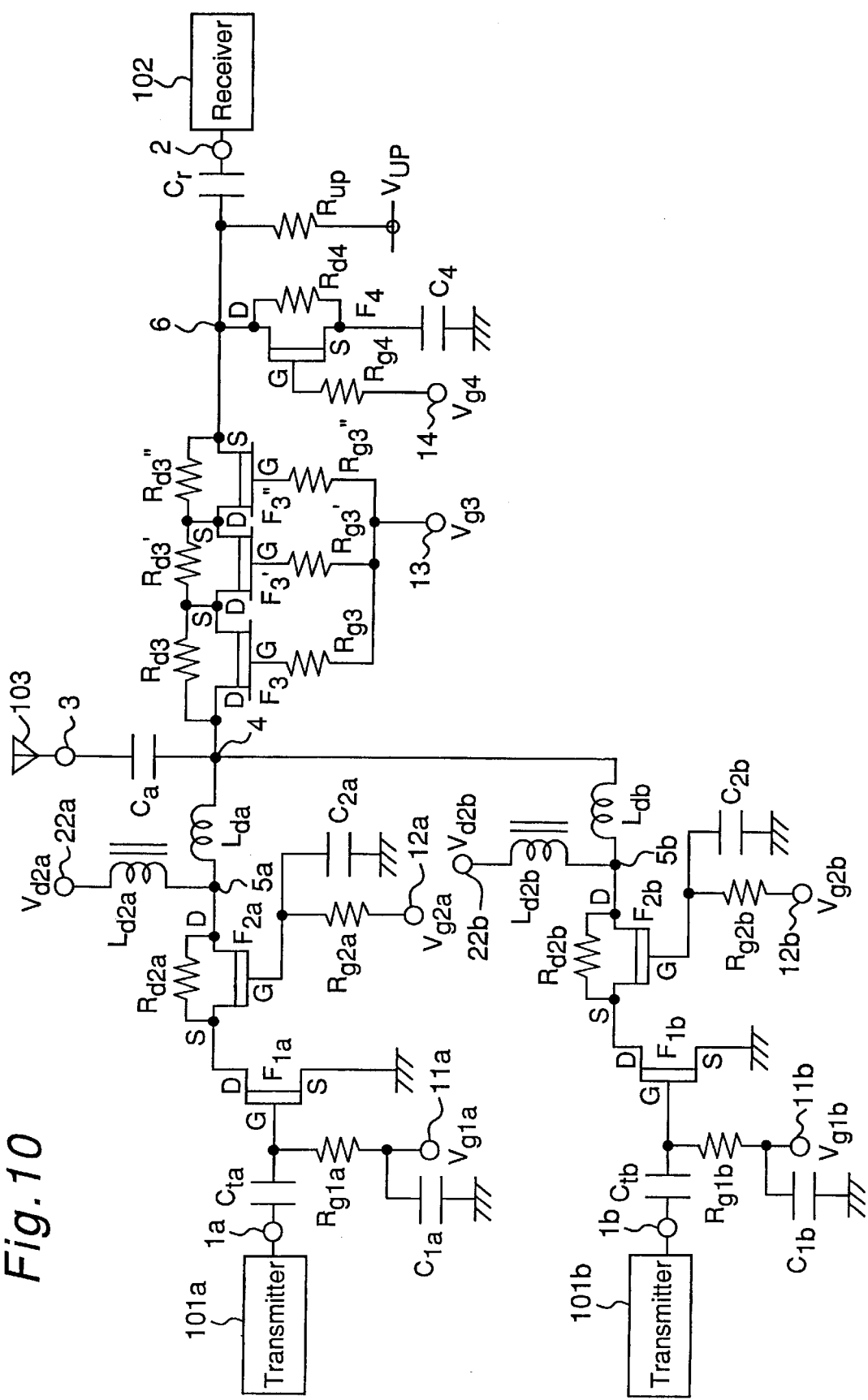
FIG. 10 is a circuit diagram showing a constitution of a duplexer circuit according to a tenth preferred embodiment of the present invention.

FIG. 10 is a circuit diagram showing a constitution of a duplexer circuit according to a tenth preferred embodiment of the present invention. The tenth preferred embodiment is a combination of the feature of the eighth preferred embodiment shown in FIG. 8 and the feature of the fourth preferred embodiment shown in FIG. 4. The tenth preferred embodiment is characterized in that, in the eighth preferred embodiment, a series connection circuit constituted by the three FETs of FET $F_3$, FET $F_3'$ and FET $F_3''$ is inserted in place of the FET $F_3$. In this case, the connecting point 4 is connected to the connecting point 6 via the drain and source of the FET $F_3$, the drain and source of the FET $F_3'$ and the drain and source of the FET $F_3''$, and further, the gates of the FETs $F_3$, $F_3'$ and $F_3''$ are connected to the gate voltage applying terminal 13 via the resistors $R_{g3}$, $R_{g3}'$ and $R_{g3}''$, respectively. It is to be noted that resistors $R_{d3}$, $R_{d3}'$ and $R_{d3}''$ are the resistors connected across the source and drain for the provision of an equal potential or voltage across the source and drain of each of the FETs $F_3$, $F_3'$ and $F_3''$.

As described above, according to the tenth preferred embodiment, by incorporating the cascode power amplifier into the transmission arm circuit of the duplexer circuit, the chip size can be remarkably reduced in the chip obtained by integrating the power amplifier with the duplexer circuit, and the insertion loss during transmission of the duplexer circuit can be reduced. Furthermore, by incorporating the two cascode power amplifiers into the duplexer circuit, there can be provided a compact duplexer circuit which can be applied to a system of two different frequencies like, for example, the so-called dual-band transceiver. Furthermore, since the number N of stages of the series connection of the FETs in the OFF-state is increased as compared with that of the first preferred embodiment, the transmissible power P of the transmission signal can be increased.

Although the two transmitters 101a and 101b are connected in the above-mentioned ninth preferred embodiment, the present invention is not limited to this, and it is acceptable to provide three or more plurality of pairs of transmission arm circuits shown in FIG. 1 and connect these plurality of pairs of transmission arm circuits to the connecting point 4.

As described above, according to the duplexer circuit of the first and second aspects of the invention, by incorporating the cascode power amplifier into the transmission arm circuit of the duplexer circuit, the chip size can be remarkably reduced in the chip obtained by integrating the power amplifier with the duplexer circuit, and the insertion loss during transmission of the duplexer circuit can be reduced.

Furthermore, in the duplexer circuit of the first aspect of the invention, the second switching circuit preferably includes a plurality of FETs that are connected in parallel with one another and are each operated to be turned off during transmission and is turned on during reception. Accordingly, by incorporating the cascode power amplifier into the transmission arm circuit of the duplexer circuit, the chip size can be remarkably reduced in the chip obtained by integrating the power amplifier with the duplexer circuit, and the insertion loss during transmission of the duplexer circuit can be reduced. Furthermore, the impedance matching of the antenna with the receiver can be more easily achieved.

Furthermore, in the duplexer circuit of the first aspect of the invention, the second switching circuit preferably includes a plurality of FETs that are connected in series with one another and are each operated to be turned off during transmission and be turned on during reception. Accordingly, by incorporating the cascode power amplifier into the transmission arm circuit of the duplexer circuit, the chip size can be remarkably reduced in the chip obtained by integrating the power amplifier with the duplexer circuit, and the insertion loss during transmission of the duplexer circuit can be reduced. Furthermore, since the number N of stages of the series connection of the FETs in the OFF-state is increased as compared with that of the first aspect of the invention, the transmissible power P of the transmission signal can be increased.

Furthermore, in the duplexer circuit of the second aspect of the invention, the second switching circuit preferably includes a plurality of FETs that are connected in parallel with one another and are each operated to be turned off during transmission and be turned on during reception. Accordingly, by incorporating the source-grounded type amplifier into the transmission arm circuit of the duplexer circuit, the chip size can be remarkably reduced in the chip obtained by integrating the power amplifier with the duplexer circuit, and the insertion loss during transmission of the duplexer circuit can be reduced. Furthermore, the impedance matching of the antenna with the receiver can be more easily achieved.

Furthermore, in the duplexer circuit of the second aspect of the invention, the second switching circuit preferably includes a plurality of FETs that are connected in series with one another and are each operated to be turned off during transmission and be turned on during reception. Accordingly, by incorporating the source-grounded type amplifier into the transmission arm circuit of the duplexer circuit, the chip size can be remarkably reduced in the chip obtained by integrating the power amplifier with the duplexer circuit, and the insertion loss during transmission of the duplexer circuit can be reduced. Furthermore, since the number N of stages of the series connection of the FETs in the OFF-state is increased as compared with that of the first and second aspects of the invention, the transmissible power P of the transmission signal can be increased.

Furthermore, in the duplexer circuit of the first aspect of the invention, the second switching circuit preferably includes a plurality of FETs that are connected in parallel and series with one another and are each operated to be turned off during transmission and be turned on during reception. Accordingly, by incorporating the cascode power amplifier into the transmission arm circuit of the duplexer circuit, the chip size can be remarkably reduced in the chip obtained by integrating the power amplifier with the duplexer circuit, and the insertion loss during transmission of the duplexer circuit can be reduced. Furthermore, the impedance matching of the antenna with the receiver can be more easily achieved. Furthermore, since the number N of stages of the series connection of the FETs in the OFF-state is increased as compared with that of the first aspect of the invention, the transmissible power P of the transmission signal can be increased.

Furthermore, according to the duplexer circuit of the third aspect of the invention, by incorporating the cascode power amplifier into the transmission arm circuit of the duplexer circuit, the chip size can be remarkably reduced in the chip obtained by integrating the power amplifier with the duplexer circuit, and the insertion loss during transmission of the duplexer circuit can be reduced. Furthermore, by incorporating the two cascode power amplifiers into the duplexer circuit, there can be provided a compact duplexer circuit which can be applied to a system of two different frequencies like, for example, the so-called dual-band device.

Furthermore, in the duplexer circuit of the third aspect of the invention, the third switching circuit preferably includes a plurality of FETs that are connected in parallel with one another and are each operated to be turned off during transmission and be turned on during reception. Accordingly, by incorporating the cascode power amplifier into the transmission arm circuit of the duplexer circuit, the chip size can be remarkably reduced in the chip obtained by integrating the power amplifier with the duplexer circuit, and the insertion loss during transmission of the duplexer circuit can be reduced. Furthermore, by incorporating the two cascode power amplifiers into the duplexer circuit, there can be provided a compact duplexer circuit which can be applied to a system of two different frequencies like, for example, the so-called dual-band transceiver. Furthermore, the impedance matching of the antenna with the receiver can be more easily achieved.

Furthermore, in the duplexer circuit of the third aspect of the invention, the third switching circuit preferably includes a plurality of FETs that are connected in series with one another and are each operated to be turned off during transmission and be turned on during reception. Accordingly, by incorporating the cascode power amplifier into the transmission arm circuit of the duplexer circuit, the chip size can be remarkably reduced in the chip obtained by integrating the power amplifier with the duplexer circuit, and the insertion loss during transmission of the duplexer circuit can be reduced. Furthermore, by incorporating the two cascode power amplifiers into the duplexer circuit, there can be provided a compact duplexer circuit which can be applied to a system of two different frequencies like, for example, the so-called dual-band transceiver. Furthermore, since the number N of stages of the series connection of the FETs in the OFF-state is increased as compared with that of the first aspect of the invention, the transmissible power P of the transmission signal can be increased.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A duplexer circuit apparatus comprising:
    a transmission arm circuit connected between a transmitter and an antenna, said transmission arm circuit including a first switching circuit turned on during transmission, and turned off during reception; and
    a reception arm circuit connected between a receiver and the antenna, said reception arm circuit including a second switching circuit comprising a plurality of field effect transistors connected in parallel with each other, each of said field effect transistors being turned off during transmission and turned on during reception, whereby either the transmitter or the receiver is selectively connected to the antenna, and wherein said transmission arm circuit comprises:
        a cascode amplifier; and
        an impedance matching inductor connected between said cascode amplifier and the antenna.

2. A duplexer circuit apparatus comprising:
    a transmission arm circuit connected between a transmitter and an antenna, said transmission arm circuit including a first switching circuit turned on during transmission, and turned off during reception; and
    a reception arm circuit connected between a receiver and the antenna, said reception arm circuit including a second switching circuit comprising a plurality of field effect transistors connected in parallel with each other, each of said field effect transistors being turned off during transmission and turned on during reception, whereby either the transmitter or the receiver is selectively connected to the antenna, and wherein said transmission arm circuit comprises:
        a source-grounded amplifier; and
        an impedance matching inductor connected between said source-grounded amplifier and the antenna.

3. A duplexer circuit apparatus comprising:
    a transmission arm circuit connected between a transmitter and an antenna, said transmission arm circuit including a first switching circuit turned on during transmission, and turned off during reception; and
    a reception arm circuit connected between a receiver and the antenna, said reception arm circuit including a second switching circuit comprising a plurality of field effect transistors connected in parallel and series with each other, each of said field effect transistors being turned off during transmission and turned on during reception whereby either the transmitter or the receiver is selectively connected to the antenna, and wherein said transmission arm circuit comprises:
        a cascode amplifier; and
        an impedance matching inductor connected between said cascode amplifier and the antenna.

4. A duplexer circuit apparatus for selectively connecting either first or second transmitters or a receiver to an antenna, comprising:
    a first transmission arm circuit connected between a first transmitter and an antenna, said first transmission arm circuit including a first switching circuit turned on during transmission, and turned off during reception;
    a second transmission arm circuit connected between a second transmitter and the antenna, said second transmission arm circuit including a second switching circuit turned on during transmission, and turned off during reception; and
    a reception arm circuit connected between the receiver and the antenna, said reception arm circuit including a third switching circuit turned off during transmission, and turned on during reception, wherein each of said first and second transmission arm circuits comprises:
        a cascode amplifier; and
        an impedance matching inductor connected between said cascode amplifier and the antenna.

5. The duplexer circuit apparatus as claimed in claim 4, wherein said third switching circuit comprises a plurality of FETs connected in parallel with one another, each of said FETs being turned off during transmission and turned on during reception.

6. The duplexer circuit apparatus as claimed in claim 4, wherein said third switching circuit comprises a plurality of FETs connected in series with one another, each of said FETs being turned off during transmission and turned on during reception.

7. A duplexer circuit device comprising:
    a capacitor connected between an antenna and a first node;
    an inductor connected between the first node and a second node;
    a cascode amplifier for amplifying a signal output from a transmitter, said cascode amplifier including a first transistor connected to the second node and outputting an amplified signal to the second node, said first transistor being turned off during reception; and
    a reception arm circuit for transmitting a signal received from the antenna to a receiver, said reception arm circuit including a second transistor connected between the first node and the receiver, said second transistor being turned off during transmission.

8. The duplexer circuit as claimed in claim 7, wherein said cascode amplifier includes a third transistor having a gate connected to the transmitter and a drain connected to said first transistor.

9. A duplexer circuit comprising:
    a capacitor connected between an antenna and a first node;
    an inductor connected between the first node and a second node;
    a source-grounded amplifier for amplifying a signal output from a transmitter, said source-grounded amplifier including a first transistor having a gate connected to the transmitter, a source connected to a ground terminal, and a drain connected to second node, said source-grounded amplifier outputting an amplified signal to the second node, said first transistor being turned off during reception; and
    a reception arm circuit for transmitting a signal received from the antenna to a receiver, said reception arm circuit including a second transistor connected between the first node and the receiver, said second transistor being turned off during transmission.

10. A duplexer circuit comprising:
    a capacitor connected between an antenna and a first node;
    an inductor connected between the first node and a second node;

an amplifier for amplifying a signal output from a transmitter, said amplifier including a first transistor connected to the second node and outputting an amplified signal to the second node, said first transistor being turned off during reception;

a reception arm circuit for transmitting a signal received from the antenna to a receiver, said reception arm circuit including a second transistor connected between the first node and the receiver, said second transistor being turned off during transmission; and a third transistor connected to said second transistor at a third node, said third transistor being turned off during reception, and a second capacitor connected between said third transistor and a ground terminal.

11. A duplexer circuit comprising:

a capacitor connected between an antenna and a first node;

an inductor connected between the first node and a second node;

an amplifier for amplifying a signal output from a transmitter, said amplifier including a first transistor connected to the second node and outputting an amplified signal to the second node, said first transistor being turned off during reception, and a reception arm circuit for transmitting a signal received from the antenna to a receiver, said reception arm circuit including a second transistor connected between the first node and the receiver, said second transistor being turned off during transmission, and a third transistor, said third transistor being turned off during reception, said second and third transistors being connected in series between the first node and the receiver.

12. A duplexer circuit comprising:

a capacitor connected between an antenna and a first node;

an inductor connected between the first node and a second node;

an amplifier for amplifying a signal output from a transmitter, said amplifier including a first transistor connected to the second node and outputting an amplified signal to the second node, said first transistor being turned off during reception; and a reception arm circuit for transmitting a signal received from the antenna to a receiver, said reception arm circuit including a second transistor connected between the first node and the receiver, said second transistor being turned off during transmission, and a third transistor, said third transistor being turned off during reception, said second and third transistors being connected in parallel between the first node and the receiver.

13. A duplexer circuit comprising:

a capacitor connected between an antenna and a first node;

a first inductor connected between the first node and a second node;

a first amplifier for amplifying a signal output from a first transmitter, said first amplifier including a first transistor connected to the second node and outputting an amplified signal to the second node, said first transistor being turned off during reception;

a reception arm circuit for transmitting a signal received from the antenna to a receiver, said reception arm circuit including a second transistor connected between the first node and the receiver, said second transistor being turned off during transmission;

a second inductor connected between the first node and a third node; and a second amplifier for amplifying a signal output from a second transmitter, said second amplifier including a third transistor connected to the third node and outputting an amplified signal to the third node, said third transistor being turned off during reception.

* * * * *